(12) United States Patent
Miller

(10) Patent No.: US 7,446,573 B1
(45) Date of Patent: Nov. 4, 2008

(54) COMPARATOR SYSTEMS AND METHODS

(75) Inventor: Edward E. Miller, Beaverton, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 213 days.

(21) Appl. No.: 11/361,643

(22) Filed: Feb. 24, 2006

(51) Int. Cl.
*G11C 7/00* (2006.01)

(52) U.S. Cl. .............................. 327/57; 327/52; 327/72

(58) Field of Classification Search .................. 327/52, 327/57, 72, 73
See application file for complete search history.

(56) References Cited

U.S. PATENT DOCUMENTS 7,271,623 B2 * 9/2007 Palmer ........................ 327/52

OTHER PUBLICATIONS

Behzad Razavi and Bruce A. Wooley, Design Techniques for High-Speed, High-Resolution Comparators, IEEE Journal of Solid-State Circuits, vol. 27, No. 12, Dec. 1992, 11 pages.

Tanchu Shih, Lawrence Der, Stephen H. Lewis, and Paul J. Hurst, A Fully Differential Comparator Using a Switched-Capacitor Differencing Circuit with Common-Mode Rejection, IEEE Journal of Solid-State Circuits, vol. 32, No. 2, Feb. 1997, 4 pages.

* cited by examiner

*Primary Examiner*—Kenneth B. Wells
*Assistant Examiner*—Ryan C Jager
(74) *Attorney, Agent, or Firm*—MacPherson Kwok Chen & Heid LLP

(57) ABSTRACT

In accordance with an embodiment of the present invention, a comparator system includes a plurality of multiplexers adapted to multiplex a number of differential input signals and a number of differential reference signals. A differencing circuit receives a differential input signal and a differential reference signal from the multiplexers and provides a differential output signal, which is used to provide a differential comparator output signal. A latch may be provided to perform differential-to-single ended conversion on the differential comparator output signal to provide a latch output signal. An output circuit may provide a registered digital output signal based on the latch output signal.

20 Claims, 5 Drawing Sheets

COMPARATOR SYSTEMS AND METHODS

TECHNICAL FIELD

The present invention relates generally to electrical circuits and, more particularly, to comparators.

BACKGROUND

Comparators are often used, for example, in voltage monitoring applications and in analog-to-digital converter (ADC) applications. In general, the design of the comparator and its performance often greatly influences the overall system performance for a given application.

A conventional comparator design may have a number of limitations for a given application, such as for example for high-speed, multi-channel design requirements. As an example, the conventional comparator may fail to accurately compare signal levels near a ground reference voltage (e.g., due to a ground reference offset or other type of offset error). As another example, the conventional comparator may have unacceptable levels of crosstalk between channels, may be too slow to adequately support the desired number of channels, and/or may consume too much die area for a desired application. As a result, there is a need for improved comparator techniques.

SUMMARY

In accordance with one embodiment of the present invention, a comparator system includes a plurality of multiplexers adapted to multiplex a number of differential input signals and a number of differential reference signals; a differencing circuit adapted to receive a differential input signal and a differential reference signal from the multiplexers and provide a differential output signal; a comparator adapted to receive the differential output signal and provide a differential comparator output signal; and a latch adapted to perform differential-to-single ended conversion on the differential comparator output signal to provide a latch output signal.

In accordance with another embodiment of the present invention, an integrated circuit includes means for selecting a differential input signal and a differential reference signal from a plurality of differential input signals and a plurality of differential reference signals; means for converting the selected differential input signal and the selected differential reference signal to a differential output signal, wherein the converting means provides an approximately constant common mode voltage for the differential output signal; means for comparing to provide a differential comparator output signal based on the differential output signal; and means for providing a registered output signal based on the differential comparator output signal, wherein the selecting means and the providing means are responsive to at least a first control signal.

In accordance with another embodiment of the present invention, a method of comparing differential signals includes selecting a differential input signal and a differential reference signal from a plurality of differential input signals and a plurality of differential reference signals; converting the selected differential input signal and the selected differential reference signal to a differential output signal, wherein the converting provides an approximately constant common mode voltage for the differential output signal; generating a differential comparator output signal based on the differential output signal; and providing a registered output signal based on the differential comparator output signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
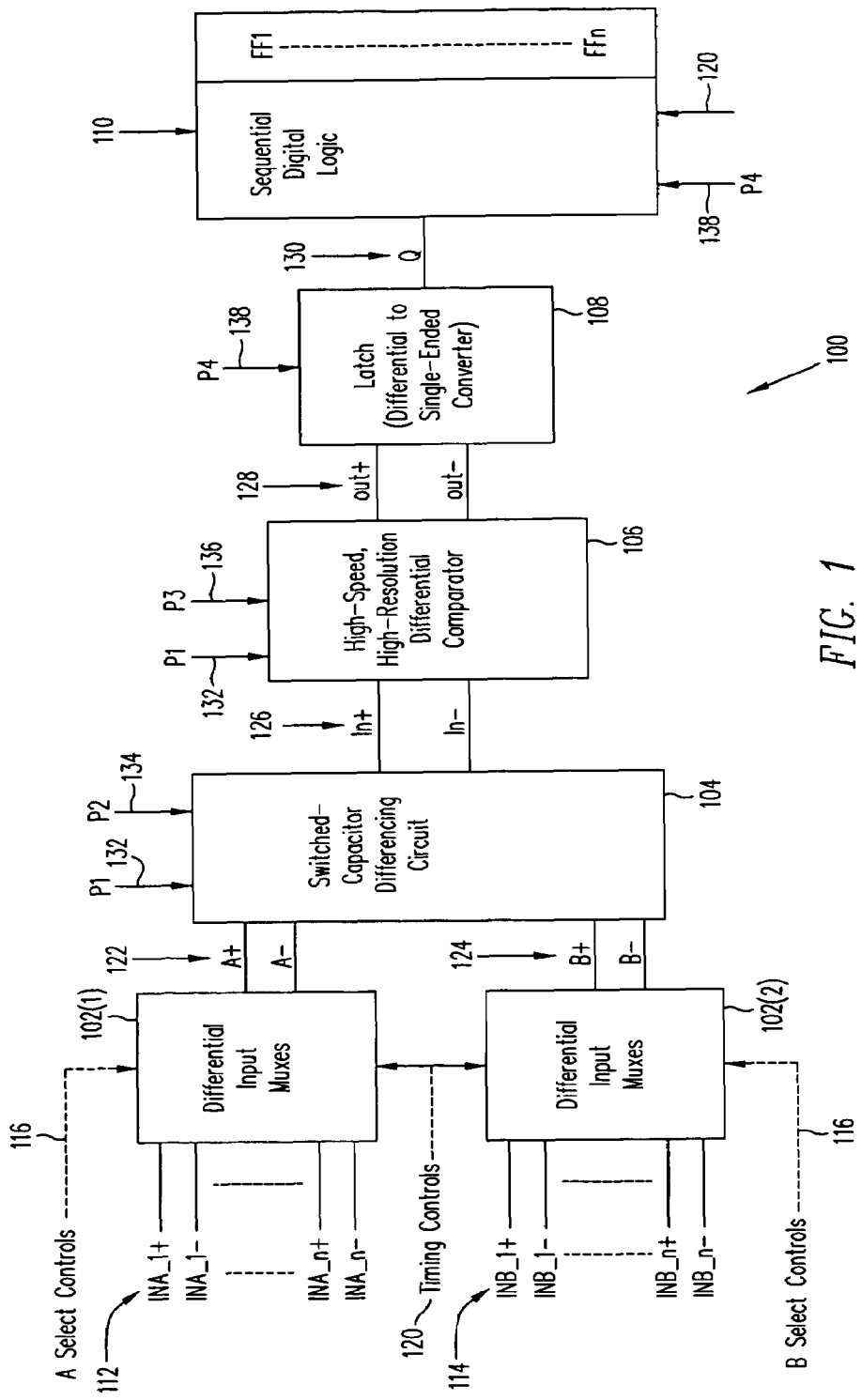
FIG. 1 shows a block diagram illustrating a comparator system in accordance with an embodiment of the present invention.

FIG. 1 shows a block diagram illustrating a comparator system 100 in accordance with an embodiment of the present invention. Comparator system 100 includes multiplexers 102, a differencing circuit 104, a comparator 106, a latch 108, and an output circuit 110.

Multiplexers 102 (e.g., separately referenced as multiplexers 102(1) and 102(2)) may represent differential input multiplexers that are provided timing control signals 120 along with selection control signals 116 for controlling selection of corresponding input signals 112 (INA_1+ and INA_1– through INA_n+ and INA_n–) and input signals 114 (INB_1+ and INB_1– through INB_n+ and INB_n–). Multiplexer 102(1) provides output signals 122 (A+ and A–) and multiplexer 102(2) provides output signals 124 (B+ and B–) to differencing circuit 104 that are based upon the selection of input signals 112 and 114.

Differencing circuit 104 (e.g., a switched-capacitor differencing circuit) receives output signals 122 and 124 and control signals 132 and 134 (labeled P1 and P2, respectively) and provides output signals 126 (in+ and in–) to comparator 106. Comparator 106 (e.g., a high-speed, high-resolution differential comparator) receives control signals 132 and 136 (P3) and provides output signals 128 (out+ and out–) based on output signals 126 from differencing circuit 104.

Output signals 128 are latched by latch 108 (e.g., a conventional latch implementation), which receives a timing control signal 138 (P4, which controls latch timing) and performs differential to single-ended conversion to provide an output signal 130. Output circuit 110 receives output signal 130 and control signal 120 and timing control signal 138 to provide sequential digital logic (e.g., window functions, filtering, and/or registering) of output signal 130.

Comparator system 100 may be viewed as representing an exemplary block diagram implementation for a true differential differencing, N-channel, time-domain-multiplexed (TDM) comparator. For example, comparator system 100 may be used to monitor multiple external voltages (e.g., input channels such as represented by input signals 112) and comparing each of these voltages with high precision (e.g., nominally 0.5% accuracy) to programmed internal reference levels (e.g., input channels 114) which are independent for each channel. These voltages, as an example, can range from 0.6 to 5.75 volts, which may be well in excess of the supply voltage and thus, precision attenuation may be required of the input channel voltage without presenting a significant load to the voltage monitored (e.g., especially important in battery-powered applications). For example, performance may be maintained over an unusually large supply voltage range of 3.3 volts ±20% (i.e., 2.64 to 3.96 volts).

In addition, comparator system 100 may accurately sense a "near-ground" level (e.g., at approximately 75 mV), and thus proper circuit operations for signals near zero volts is provided. Furthermore, because the monitored voltage may have a significant ground reference offset versus the internal ground inside an integrated circuit (IC) incorporating comparator system 100, each monitored voltage must be sensed differentially to remove the ground difference error. Otherwise, the ground difference error may prevent any compare versus the "near-ground" reference level. As an example, the external ground sensed may be allowed to be above or below the internal IC ground by up to 300 mV.

In general, conventional approaches have found that precision differential differencing is challenging for even one channel much less multiple channels. For example, a differential difference comparison requires that the difference between two measured voltages, e.g., Vinp1 and Vinn1, be compared to two different voltages, e.g., Vrefp and Vrefn, where Vrefn is nominally the internal IC ground (i.e., the most negative voltage in the IC). However, even the Vrefn voltage may not be a true ground because the finite resistance of metal wires in the IC can result in several millivolts of error, depending on where the IC ground is sensed for the comparison. Therefore, the internal ground sense in the IC must also sense the ground voltage at the source of the reference voltages used for comparison for precision to be maintained. Consequently, there may be a total of four voltages for one comparison.

Specifically, for example, each input channel may be compared to two reference levels, or trip points, to determine if the voltage is within range, below range, or above range, based on the desired application and requirements. For multiple channels, comparator system 100 may have to perform these comparison operations on multiple channels in a limited amount of time (e.g., on 12 input channels for a total of 24 compares in less than 20 microseconds). Furthermore for example and as discussed further herein, crosstalk between input channels, even if driven as logic signals, which generate noise and large signal swings, generally must not be allowed to degrade the specified comparator precision of comparator system 100.

Figure 2:
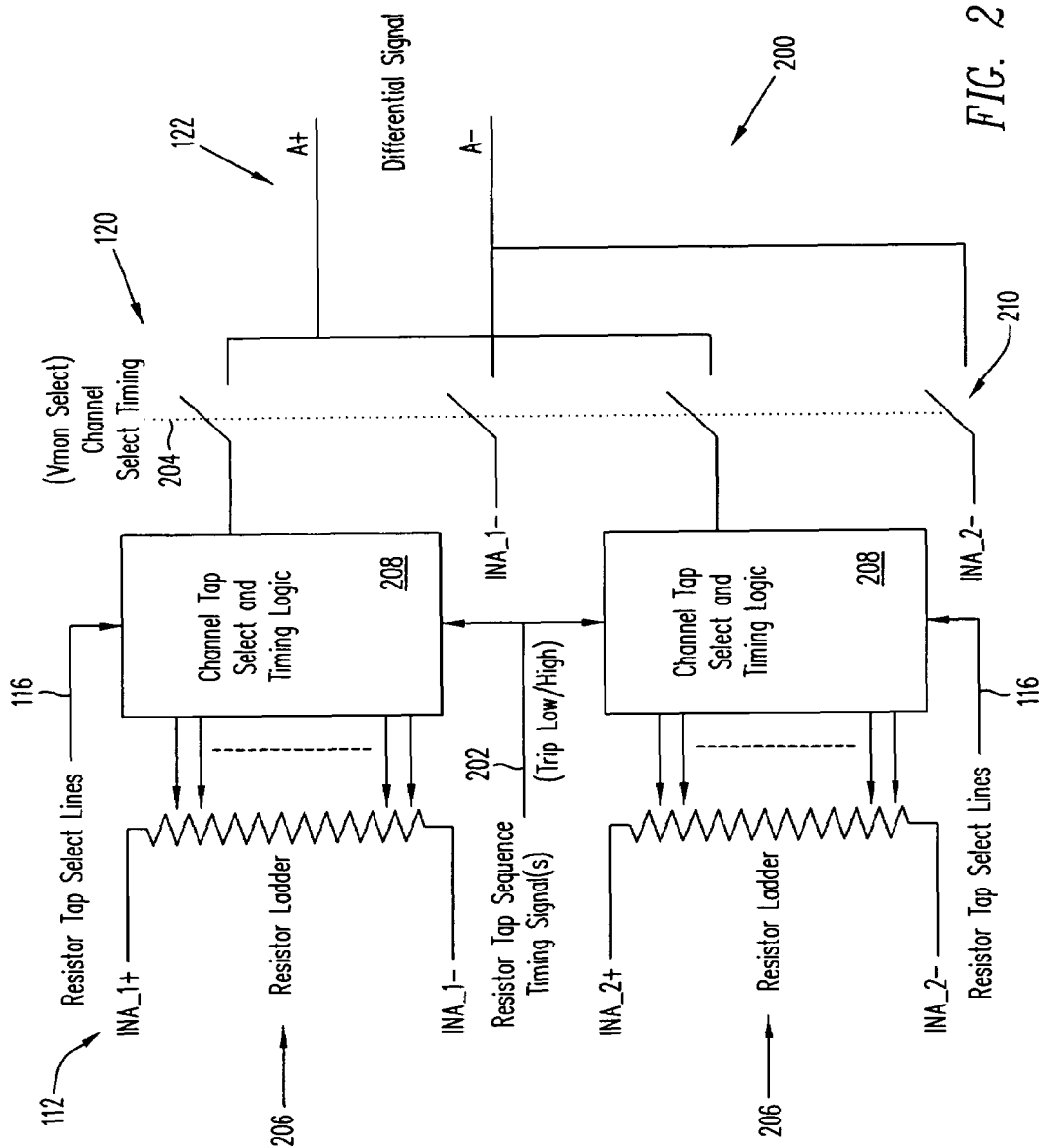
FIG. 2 shows a block diagram illustrating an exemplary implementation of a multiplexer portion of the comparator system of FIG. 1 in accordance with an embodiment of the present invention.

FIG. 2 shows a circuit 200 illustrating an exemplary implementation of a multiplexer 102 (e.g., multiplexer 102(1)) of comparator system 100 of FIG. 1 in accordance with an embodiment of the present invention. Circuit 200 provides a differential TDM input multiplexer and provides exemplary multiplexing details for input channels (e.g., input signals 112) and tap points.

Circuit 200 includes resistor ladders 206, tap selection logic 208, and switches 210. Tap selection logic 208 (e.g., channel tap select and timing logic) receives control signals 202 (e.g., resistor tap sequence timing signals) and selection control signals 116 (e.g., resistor tap select lines) to control the selection of taps from resistor ladders 206, which are provided with input signals 112 (e.g., differential signal INA_1+ and INA_1− and differential signal INA_2+ and INA_2−).

Control signals 120 may be represented by control signals 202 and 204. Control signals 202 (also referred to herein as Trip Low/High) control resistor tap sequencing, while control signals 204 (also referred to herein as Vmon Select) control channel selection via switches 210 to provide output signals 122 (e.g., A+ based on INA_1+ or INA_2+, and A− based on INA_1− or INA_2−). Control signals 202 and 204 control the sequence of selection of input signals 112 (and input signals 114 as shown in FIG. 1).

Selection control signals 116, for example, may be static signals (e.g., provided by programmable memory bits, such as non-volatile EE bits or volatile SRAM bits) for selecting the resistor taps. As a specific example, there may be six bits programmed for each tap point on each channel (e.g., 24 bits for 4 compares times 6 bits each), with the programmed bits specifying the resistor tap required for each and every compare. Furthermore as an example, control signals 202 sequence through the trip points for each channel, while control signals 204 select the desired channel for the trip point sequencing.

Figure 3:
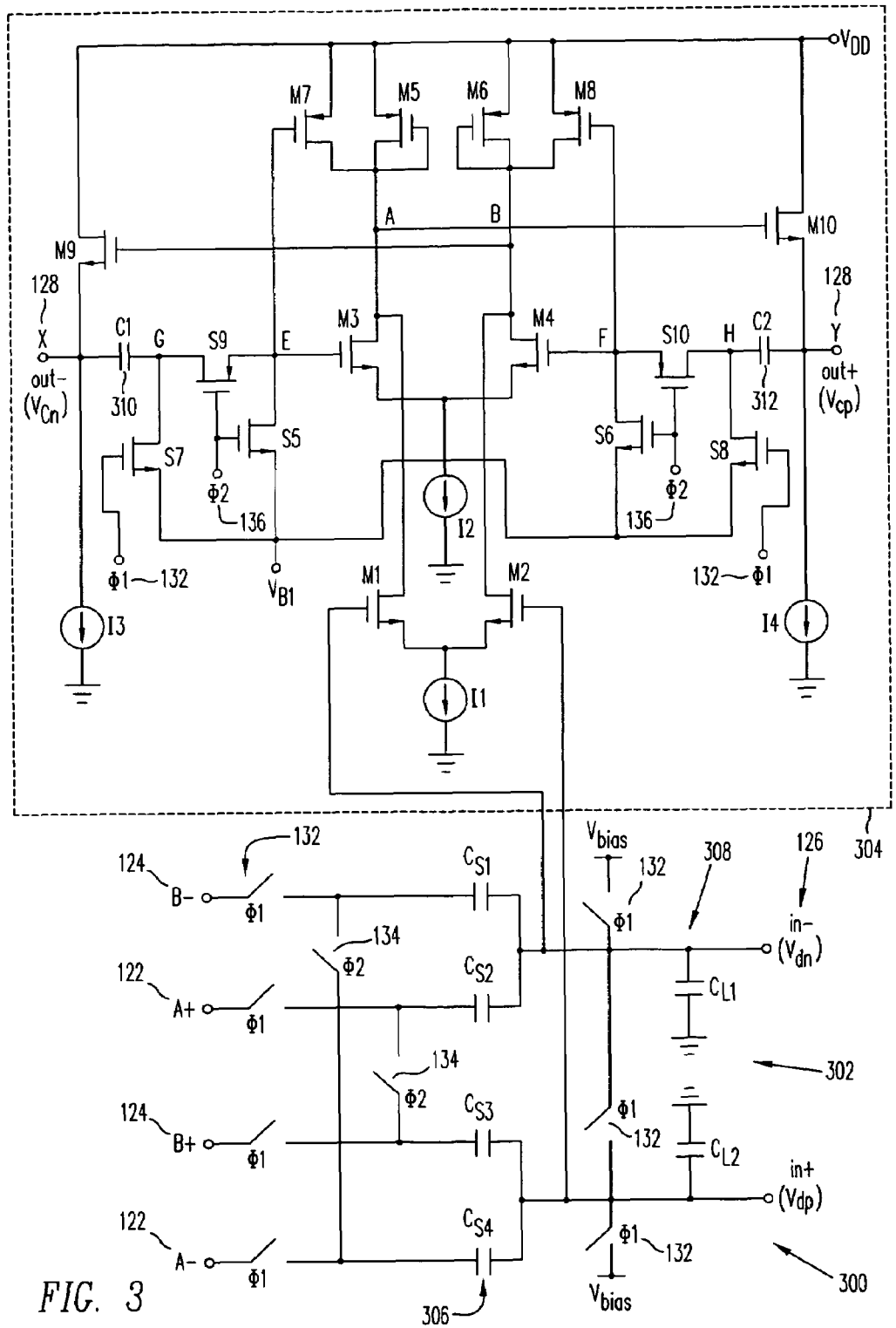
FIG. 3 shows a block diagram illustrating an exemplary implementation of a comparator portion of the comparator system of FIG. 1 in accordance with an embodiment of the present invention.

FIG. 3 shows a circuit 300 illustrating an exemplary implementation of differencing circuit 104 and comparator 106 of comparator system 100 of FIG. 1 in accordance with an embodiment of the present invention. Circuit 300 may be viewed as including a circuit 302 and a circuit 304, with circuit 302 providing a specific circuit implementation for differencing circuit 104, and circuit 304 providing a specific circuit implementation for comparator 106.

Circuit 302 provides a front-end circuit for circuit 304 (e.g., comparator 106) to address true differential differencing for input signals 122 and 124, while stabilizing the input bias. In addition, latch 108 and output circuit 110 provides a latch/output amplifier to provide signal gain and hold the comparison results as a digital output (e.g., for further processing).

In general, conventional approaches fail to provide true differential differencing comparisons over the range of voltages required to allow ground sensing. For example, although some conventional approaches may imply the ability to handle true differential signals based on sensing two independent reference voltages, these conventional approaches typically can not handle reference voltages at or below the minimum voltage (e.g., internal ground) in the IC, because the input devices (e.g., NMOS) generally require a positive $V_{GS}$ bias voltage that may not be available for some applications.

Furthermore, conventional approaches may be limited due to the common mode signal between the input and reference signal levels degrading comparator performance due to both the variability and the size of the voltage difference (e.g., commonly referred to as non-ideal common mode rejection). Thus, common mode rejection over an extremely large supply voltage range is generally difficult to achieve.

In contrast, circuit 302, operating as a differential difference signaling circuit (e.g., so that an external ground reference can be provided as an input with a signal to be monitored such that DC ground shifts are not an error source in the monitoring activity), may provide superior performance and may avoid common mode signal problems associated with conventional input sampling techniques. Specifically, circuit 302 operates to differentially sample both the monitored input voltage and the internally generated reference voltage (i.e., input signals 122 and 124), while the output is shorted to a bias voltage, and then convert the differential difference voltages stored into a single differential voltage (i.e., output signals 126) at the output when the bias voltage is disconnected.

Consequently, the single differential voltage has a bias voltage (labeled $V_{bias}$) as its common mode voltage, so the input bias to circuit 304 (the comparator) is stable at the bias voltage during both the sampling time and the compare time. The various current sources (e.g., labeled I1, I2, I3, and I4) and bias voltages (e.g., labeled $V_{bias}$ and $V_{B1}$ and which may be approximately equal) may be provided, for example, by one or more conventional reference generators (e.g., a bias circuit providing low impedance references). With a stable input bias, circuit 304 can be optimized for performance with the bias voltage as its sole input common mode level, so common mode rejection is not an issue. Circuit 302 provides the additional key benefit of establishing the input common mode, which is a low impedance to reduce switching noise and eliminate crosstalk between sequential compares at the same comparator. For example for a plurality of comparator systems 100, by making the bias voltage unique to each comparator 106, crosstalk between comparators 106 may be eliminated.

Circuit 304 operates in two phases consistent with circuit 302 (the input switched capacitor circuit). When circuit 302 samples the monitored input channel (e.g., output signal 122 (A+, A−)) and the reference voltage (e.g., output signal 124 (B+, B−)), both differentially, the inputs of circuit 304 are shorted to the bias voltage ($V_{bias}$) and the net input-referred offset of circuit 304 is stored on capacitors 310 and 312 (labeled C1 and C2, respectively). Because both sides of switches S9 and S10 are shorted to the bias voltage ($V_{bias}$), nodes E and F are at the same voltage as nodes G and H. The offset voltage stored will therefore provide no net signal for the regenerative latch input pair, transistors M3 and M4, to amplify. When circuit 302 converts the input voltages (e.g., output signals 122 and 124) to a single differential voltage (e.g., output signal 126), the comparator offset storage is disabled so the signal is not added to the stored offset. After a delay to allow the input to settle, circuit 304 performs a comparison by enabling the regenerative latch to amplify the input signal (i.e., output signal 126) to a level sufficient to reliably compare, with the result latched by latch 108.

The basic concept of circuit 302 was tested as an input stage for a 3-bit analog-to-digital converter (ADC) as disclosed by Shih et al. in a paper entitled "A Fully Differential Comparator Using a Switched-Capacitor Differencing Circuit with Common-Mode Rejection" (IEEE Journal of Solid-State Circuits, Vol. 32, No 2, February 1997, pp. 250-253). Furthermore, a portion of circuit 304 was disclosed by Behzad Razavi and Bruce A. Wooley in a paper entitled "Design Techniques for High-Speed, High-Resolution Comparators" (IEEE Journal of Solid-State Circuits, Vol. 27, No 12, December 1992, pp. 1916-1926) [herein referred to as the Razavi reference]. However, to perform true differential differencing, the comparator disclosed in the Razavi reference was modified by replacing its input switches S1-S4 with circuit 302, which performs the conversion of a differential difference voltage consisting of 4 voltages, into an ordinary differential voltage for circuit 304.

Thus, it should be understood that circuit 300 may provide certain advantages over conventional approaches. For example, input signals 122 and 124 are not only true differential difference voltages, but the sequential storage of voltages and conversion to a single differential output (output signal 126) lends itself to time-domain multiplexing (TDM) of multiple input channels and multiple reference compare voltages to allow a single comparator (e.g., circuit 304) to perform the functions of many conventional comparators. As another example, holding output signal 126 to a bias voltage while sampling the inputs (e.g., input signals 122 and 124) eliminates crosstalk between comparators (e.g., in other neighboring comparator systems 100) and between sequential samples at the same comparator, and further provides a stable input level for optimizing the comparator bias and operation. Thus, as circuit 304 is capable of high-speed operation, the main limitation to speed is providing sufficient time for sampling of the inputs to allow for settling to an error below the noise levels of the overall comparator system architecture.

Capacitive sampling of voltages is normally done with low impedance sources, because input impedance imbalances and clock feed through switching noise can cause errors in the sampled voltages. However, any impedance issues may be addressed, for example, by careful re-balancing of impedances at the input to circuit 302, along with careful switching noise cancellation using dummy switches, as would be understood by one skilled in the art.

For circuit 302 as an example of a general exemplary application, during phase 1 (e.g., control signal 132 asserted to close the associated switches) the monitored voltages of input signals 122 and 124 are stored. Capacitors 306 (labeled $C_{s1}$ through $C_{s4}$) in general should be reasonably identical because the voltages are stored as charge, and the re-distribution of charge during conversion to a differential output will result in errors due to capacitance mismatch if they are not identical within the limits of the state of the art and practical limitations on area for the desired application. Capacitors 308 (labeled $C_{L1}$ and $C_{L2}$) represent parasitic input capacitances of circuit 304, which can be minimized as would be understood by one skilled in the art.

During phase 2 (e.g., control signal 134 is asserted to close the associated switches and control signal 132 is unasserted to open the associated switches), charge is redistributed such that the final output voltage may be represented in the form as shown in equations 1-4, $$Vocm = V_{bias} \quad (1)$$

$$Vod = (Vid - Vrd) * C_S / (2 * C_S + C_L) \quad (2)$$

$$Vid = A+ - B+ \quad (3)$$

$$Vrd = A- - B- \quad (4)$$

where Vocm is the output common mode voltage and Vod is the output differential voltage for output signal 126, and $C_S$ and $C_L$ are exemplary values for each of capacitors 306 and 308, respectively.

Because Vocm is unchanged from $V_{bias}$, the bias level may be optimized for the comparator performance of circuit 304 in a small input voltage range. In addition, no common-mode error signals are present at the comparator input of circuit 304. As an example, with capacitors 308 held to a low value, circuit 302 may be viewed as essentially dividing the differential signal by two, which may require a more stringent requirement on circuit 304. Furthermore, circuit 302 requires four input capacitors (i.e., capacitors 306), which may need to be sized such that capacitor 306 is much greater than capacitor 308 (e.g., $C_S \gg C_L$) to avoid gain loss. However, with a DC-input comparator design of small input capacitance, this generally is not a significant limitation.

Figure 5:
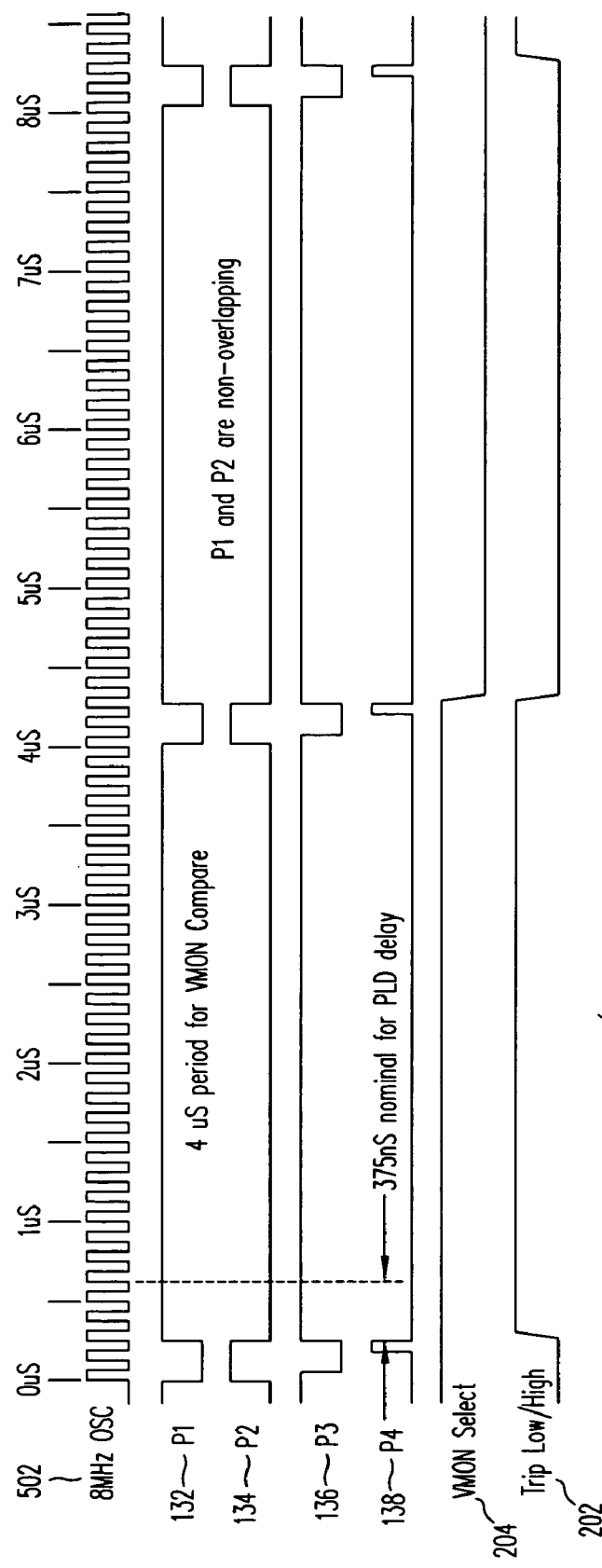
FIG. 5 shows an exemplary timing diagram for the comparator system of FIG. 1 in accordance with an embodiment of the present invention.

In general, the exact timing of the edges of control signals 132 (P1), 134 (P2), and 136 (P3) is very important for proper circuit operation to avoid signal loss and introduction of errors, as would be understood by one skilled in the art and determined for the desired application and timing requirements. An exemplary implementation example, as discussed in reference to FIG. 5, provides further details for an exemplary application.

Figure 4:
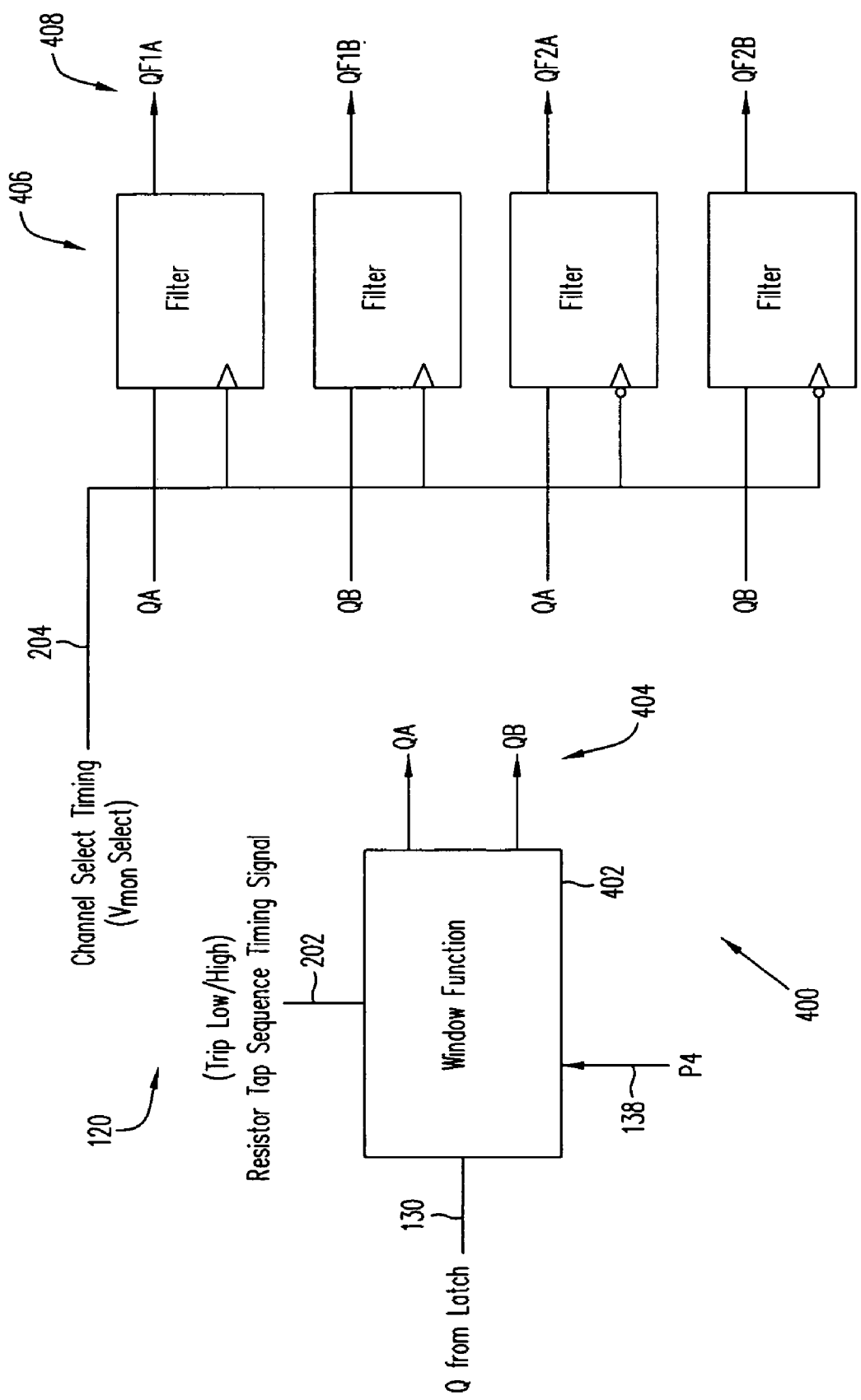
FIG. 4 shows a block diagram illustrating an exemplary implementation of an output portion of the comparator system of FIG. 1 in accordance with an embodiment of the present invention.

FIG. 4 shows a circuit 400, which is an exemplary circuit implementation of output circuit 110 of comparator system 100 of FIG. 1 in accordance with an embodiment of the present invention. Circuit 400 provides an exemplary implementation of sequential digital logic for post-processing of comparator results from comparator 106 to provide registered outputs.

Circuit 400 processes output signal 130 with a window function 402 to provide output signals 404 (labeled QA and QB). Window function 402, which determines whether the results provided by output signal 130 are between the trip point settings, receives timing control signals, such as timing control signal 138 and control signals 202. Window function 402, for example, may be enabled or disabled. When disabled, the two trip points give independent above/below trip point output signals (QA and QB), with the QA and QB components of output signals 404 being the trip high threshold and the trip low threshold, respectively.

Output signals 404 are provided to circuits 406, which digitally filter (e.g., low pass filter) and register the signals based on control signal 204 to provide registered output signals 408 (e.g., QF1A, QF1B, QF2A, and QF2B). Control signal 120 may be represented, for example, by control signals 202 and 204, as discussed in reference to FIG. 2. Consequently for example, the timing which establishes the compare sequence using multiplexers 102 to handle a number of compares (e.g., "N") by comparator 106 is also the timing provided to correctly reconstruct the results (e.g., the "N" compare results) using output circuit 110.

FIG. 5 shows an exemplary timing diagram 500 for comparator system 100 of FIG. 1 in accordance with an embodiment of the present invention. Timing diagram 500 includes exemplary waveforms for control signals 132, 134, 136, 138, 202, and 204 along with an exemplary clock signal 502 (e.g., an 8 MHz oscillating signal).

In general, for an exemplary circuit operation for comparator system 100, control signals 120 (e.g., control signals 202 and 204) control the multiplexing of the input signals between two channels and two trip points to provide time-domain multiplexing of the input signals (e.g., input signals 112 and 114). For example, input signal 112 (e.g., INA_1+ and INA_1−) is a differential signal and represents one channel, where the INA_1− may be a signal near ground externally sensed to account for ground differences. Input signal 112 is compared to input signal 114 (e.g., INB_1+ and INB_1−), which may be an internally generated differential reference signal with the INB_1+ being a reference signal and the INB_1− being the internal ground. Alternatively, instead of the internal ground, the INB_1− may be provided by a signal that senses the local on-chip ground at comparator system 100 or at the internal reference generator circuit so that internal ground errors do not impact the comparison.

Control signal 202 (Trip Low/High) alternates between two reference set points for each channel sensed by comparator 106. Control signal 204 (VMON Select) alternates between two channels at half the rate of the switching of control signal 202 so that comparator 106 operates on one channel, first at trip point 1 then trip point 2, then switches to a second channel, again at trip point 1 then trip point 2 (e.g., which may not be the same as for channel 1). It should be noted that this is exemplary and not limiting regarding the choice of two channels and two trip points. For example, one comparator 106 could sample N channels at a single trip point (where N is arbitrary), depending only on the acceptable latency in acquiring results. Alternatively for example, one comparator 106 could sense a single channel at N trip points, by applying the general techniques disclosed herein in accordance with one or more embodiments of the present invention. Thus, in contrast to conventional approaches, comparator system 100 provides a time-domain multiplexed system that can sense in a true differential differencing mode for both inputs of the compare.

For the exemplary application example of FIG. 5, the timing signals are generated from clock signal 502 (e.g., 8 MHz OSC clock signal), with a 4 microsecond cycle. The sampling of input signals 112 and 114 is performed when control signal 132 (P1) and control signal 136 (P3) are high (logical high value) and control signal 134 (P2) is low (logical low value), with timing control signal 138 (P4) also low during the sample. In this example, the sampling time is relatively long (e.g., 3.75 μS of the 4.00 μS compare cycle) to provide sufficient time to accurately acquire the analog signal.

The comparison starts when control signal 132 (P1) goes low, which disconnects the sampled input signals (input signals 112 and 114) from comparator 106. Differencing circuit 104 is now storing the charge on its capacitors (e.g., capacitors 306) and its inputs are free to switch to another signal at any time. As an example, the switching may not be done until after the comparison is complete to ensure that noise from the switching does not add uncertainty to the answer. Also, output signal 126 is no longer tied to the bias voltage ($V_{bias}$) and is allowed to float as driven by other changes when they occur.

Control signal 134 (P2) goes high (e.g., after a small analog delay of nominally 6 nanoseconds) and the charge on capacitors 306 of circuit 302 are rearranged so that output signal 126 changes from the bias voltage to the bias voltage plus and minus a delta, where for example the delta is about half the difference between the two differential input signals (e.g., input signals 122 and 124). After the signals settle, then the difference signal is amplified across nodes A and B of circuit 304. Transistors M9 and M10 (e.g., level shifters) pass the amplified signal to both sides of capacitors 310 and 312. There is no charge lost on capacitors 310 and 312 because transistors S7, S8, S9 and S10 (e.g., switches) are all closed. Now nodes G and H (the capacitor nodes at these switches) hold the amplified signal in addition to the offset cancellation voltage acquired during input sampling. Control signal 136 (P3) is delayed by one-half a clock cycle of clock signal 502 to allow time for the signal to settle and maximize and, when control signal 136 (P3) goes low, the result is provided to latch 108 (clocked by timing control signal 138 (P4)) to latch the correct polarity of the input difference and amplify the result.

Systems and methods are disclosed herein to provide comparator techniques. For example, in accordance with an embodiment of the present invention, a true differential differencing, multi-channel, time-domain-multiplexed (TDM) comparator system is provided that may provide certain advantages, such as a wide voltage compare range and ground sensing at each channel. The comparator system may include a switched capacitor circuit (differential differencing circuit) that can be used as a TDM element to access multiple input channels and multiple reference compare voltages. The comparator system further includes a comparator circuit, adapted to the switched capacitor circuit by replacing its input switch circuit (switches S1-S4, as the NMOS pairs can not operate at ground voltage levels) with the switched capacitor circuit.

The switched capacitor circuit may provide an ideal input stage for operation of the comparator circuit, because the output of the switched capacitor circuit is shorted to a bias voltage that is suited for use also as the bias voltage of the comparator circuit, which ensures that all input devices are biased to operate in their saturated region that may be preferred for predictable performance. Furthermore, the nature of the switched capacitor circuit operation allows for adjusting the bias voltage to any voltage required to optimize the comparator circuit operation. Thus, the switched capacitor circuit, for example, can be extended by careful matching and scaling to facilitate a precision comparison operation on the order of 0.5% accuracy. As a further example, the inputs to the switched capacitor circuit, with inputs of widely varying impedances, can be impedance matched to cancel input errors due to switching noise and imbalanced inputs.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A comparator system comprising:
   a plurality of multiplexers adapted to multiplex a number of differential input signals and a number of differential reference signals;
   a differencing circuit adapted to receive a differential input signal and a differential reference signal from the multiplexers and provide a differential output signal;
   a comparator adapted to receive the differential output signal and provide a differential comparator output signal; and
   a latch adapted to perform differential-to-single ended conversion on the differential comparator output signal to provide a latch output signal, and
   an output circuit adapted to receive the latch output signal and process the latch output signal to provide a registered digital output signal,
   wherein:
      the latch and the output circuit are controlled by at least a first timing control signal;
      the output circuit and the multiplexers are controlled by at least a second timing control signal; and
      the output circuit processes the latch output signal with a window function and at least one filter.

2. The comparator system of claim 1, wherein the comparator system provides a true differential differencing N-channel time-domain-multiplexed comparator system.

3. The comparator system of claim 1, wherein at least a first selection control signal controls the selection of the differential input signal and the differential reference signal, and at least a second timing control signal controls the timing of the differential input signal and the differential reference signal to provide time-domain differential multiplexing.

4. The comparator system of claim 1, wherein the differencing circuit and the comparator are responsive to a first control signal.

5. A comparator system comprising:
   a plurality of multiplexers adapted to multiplex a number of differential input signals and a number of differential reference signals;
   a differencing circuit adapted to receive a differential input signal and a differential reference signal from the multiplexers and provide a differential output signal;
   a comparator adapted to receive the differential output signal and provide a differential comparator output signal; and
   a latch adapted to perform differential-to-single ended conversion on the differential comparator output signal to provide a latch output signal,
   wherein the plurality of multiplexers comprises:
      a plurality of reference ladders adapted to receive the differential input signals and the differential reference signals; and
      at least one tap selection circuit adapted to select taps from the plurality of reference ladders to provide as the differential input signal and the differential reference signal based on at least a first selection control signal.

6. The comparator system of claim 5, wherein the comparator system provides a true differential differencing N-channel time-domain-multiplexed comparator system.

7. A comparator system comprising:
   a plurality of multiplexers adapted to multiplex a number of differential input signals and a number of differential reference signals;
   a differencing circuit adapted to receive a differential input signal and a differential reference signal from the multiplexers and provide a differential output signal;
   a comparator adapted to receive the differential output signal and provide a differential comparator output signal; and
   a latch adapted to perform differential-to-single ended conversion on the differential comparator output signal to provide a latch output signal,
   wherein the comparator system is one of a plurality of comparator systems within an integrated circuit, with a different bias voltage provided to each of the differencing circuits of the corresponding comparator systems.

8. The comparator system of claim 7, wherein at least a first selection control signal controls the selection of the differential input signal and the differential reference signal, and at least a second timing control signal controls the timing of the differential input signal and the differential reference signal to provide time-domain differential multiplexing.

9. The comparator system of claim 7, wherein the differencing circuit and the comparator are responsive to a first control signal.

10. The comparator system of claim 7, wherein the comparator system provides a true differential differencing N-channel time-domain-multiplexed comparator system.

11. An integrated circuit comprising:
   means for selecting a differential input signal and a differential reference signal from a plurality of differential input signals and a plurality of differential reference signals;
   means for converting the selected differential input signal and the selected differential reference signal to a differential output signal, wherein the converting means provides an approximately constant common mode voltage for the differential output signal;
   means for comparing to provide a differential comparator output signal based on the differential output signal; and
   means for providing a registered output signal based on the differential comparator output signal, wherein the selecting means and the providing means are responsive to at least a first control signal,
   wherein the at least first control signal provides a first clock signal and a second clock signal that is one-half the frequency of the first clock signal, with the first clock signal controlling selection of the differential input signal and the second clock signal controlling the selection of the differential reference signal.

12. The integrated circuit of claim 11, wherein the providing means is adapted to provide differential-to-single ended conversion on the differential comparator output signal.

13. The integrated circuit of claim 11, wherein the selecting means, the converting means, the comparing means, and the providing means is adapted to provide true differential differencing N-channel time-domain-multiplexing.

14. The integrated circuit of claim 11, wherein the converting means and the comparing means are responsive to a second control signal.

15. The integrated circuit of claim 11, wherein the selecting means, converting means, comparing means, and providing means provides a comparator system, and wherein the integrated circuit comprises a plurality of the comparator systems each having a different bias voltage for the converting means.

16. A method of comparing differential signals, the method comprising:
   selecting a differential input signal and a differential reference signal from a plurality of differential input signals and a plurality of differential reference signals;
   converting the selected differential input signal and the selected differential reference signal to a differential output signal, wherein the converting provides an approximately constant common mode voltage for the differential output signal;
   generating a differential comparator output signal based on the differential output signal; and
   providing a registered output signal based on the differential comparator output signal,
   wherein the selecting, the converting, the generating, and the providing provides one of a number of comparator systems, and wherein each of the comparator systems has a different bias voltage for the converting.

17. The method of claim 16, wherein the providing is adapted to provide differential-to-single ended conversion on the differential comparator output signal.

18. The method of claim 16, wherein the selecting, the converting, the generating, and the providing is adapted to provide true differential differencing N-channel time-domain-multiplexing.

19. The method of claim 16, wherein the selecting and the providing are responsive to at least a first control signal, and the converting and the generating are responsive to at least a second control signal.

20. The method of claim 16, wherein the selecting and the providing are responsive to at least a first control signal which provides a first clock signal and a second clock signal that is one-half the frequency of the first clock signal, with the first clock signal controlling selection of the differential input signal and the second clock signal controlling the selection of the differential reference signal.

* * * * *